United States Patent [19]

Kenney

[11] Patent Number: 5,684,313

[45] Date of Patent: Nov. 4, 1997

[54] VERTICAL PRECHARGE STRUCTURE FOR DRAM

[76] Inventor: Donald M. Kenney, 18 Birch Rd., Shelburne, Vt. 05482

[21] Appl. No.: 603,832

[22] Filed: Feb. 20, 1996

[51] Int. Cl.$^6$ .................... H01L 27/108; H01L 29/76; H01L 29/94; H01L 31/119

[52] U.S. Cl. .................... 257/296; 257/303; 257/304

[58] Field of Search .................... 257/296, 304, 257/307, 303; 365/182, 149; 437/228

[56] References Cited

U.S. PATENT DOCUMENTS

| | | | |
|---|---|---|---|
| Re. 33,972 | 6/1992 | Gamache et al. | 365/182 |
| 4,295,924 | 10/1981 | Gamache et al. | 156/643 |
| 4,801,988 | 1/1989 | Kenney | 357/23.6 |
| 4,855,953 | 8/1989 | Tsukamoto et al. | 257/296 |
| 4,910,567 | 3/1990 | Malhi | 257/296 |
| 4,914,740 | 4/1990 | Kenney | 357/236 |
| 4,949,138 | 8/1990 | Nishimura | 257/296 |
| 4,966,870 | 10/1990 | Barber et al. | 437/228 |
| 4,984,055 | 1/1991 | Okumura et al. | 257/296 |
| 5,032,882 | 7/1991 | Okumura et al. | 257/303 |
| 5,101,257 | 3/1992 | Hayden et al. | 257/327 |
| 5,101,262 | 3/1992 | Ariizumi et al. | 257/327 |
| 5,196,722 | 3/1993 | Bergendahl et al. | 257/304 |
| 5,327,374 | 7/1994 | Krautschneider et al. | 257/304 |
| 5,414,656 | 5/1995 | Kenney | 365/149 |

OTHER PUBLICATIONS

Nguyen et al., "Substrate Trenching Mechanism during Plasma and Magnetically Enhanced Polysilicon Etching," J. Electrochem. Soc., vol. 138, No. 4, Apr. 1991, pp. 1112–1117.

Kenney, "Self Aligned U–Groove Gates for Field Effect Transistors," IBM Technical Disclosure Bulletin, vol. 22, No. 10, Mar. 1980, pp. 4448–4449.

Davari et al., "A New Planarization Technique Using a Combination of RIE and Chemical Mechanical Polish (CMP)," Internatioal Electron Devices Meeting, Dec. 1989, pp. 61–64.

Fazen et al., "A Highly Manufacturable Trench Isolation Process for Deep Submicron DRAMs," International Electron Devices Meeting, Dec. 1993, pp. 57–60.

Kimura et al., "A Diagonal Active–Area Stacked Capacitor DRAM Cell with Storage Capacitor on Bit Line," IEEE Trans. on Electron Devices, vol. 37, No. 3, Mar. 1990, pp. 737–743.

Armacost et al., "Selective Oxide:Nitride Dry Etching in a High Density Plasma Reactor," Electrochemical Society Meeting, May 1992.

*Primary Examiner*—Sara W. Crane
*Assistant Examiner*—Phat X. Cao

[57] ABSTRACT

A DRAM one device cell and an associated precharge circuit are integrated together in a novel structure having an area of only four square features. The structure also provides physical and electrical separation between adjacent cells along a direction parallel to the DRAM word lines. The DRAM bit line length per bit is reduced by 50% relative to a conventional planar integrated structure disclosed elsewhere. As a result, bit line capacitance is also substantially reduced, and the effectiveness of a precharge technique for reduction of DRAM power consumption is enhanced by the dense novel structure.

6 Claims, 10 Drawing Sheets

> # 5,684,313

1

VERTICAL PRECHARGE STRUCTURE FOR DRAM

FIELD OF INVENTION

This invention relates to DRAM memory arrays in which the capacitive storage elements are precharged prior to a data write operation.

BACKGROUND OF THE INVENTION

U.S. Pat. No. 5,414,656 issued May 9, 1995 to Kenney describes a precharge circuit for DRAM memory cells which allows a very low rate of electric charge consumption from a power supply to be achieved. According to U.S. Pat. No. 5,414,656 a DRAM precharge circuit can be a single precharge transistor connected between each cell storage node and a precharge voltage source. All the precharge transistors along an individual access word line of the DRAM array are controlled by a corresponding, and parallel, precharge word line. The precharge circuit is illustrated using conventional planar transistor structures, and results in an array area of eight square features per memory bit when the precharge circuit is included with the DRAM cell as part of the array area. This bit density is equivalent to that of common DRAM array structures that do not include a precharge circuit. As a result, a DRAM with precharge circuits can be cost competitive with conventional DRAM products.

The concept of measuring array bit areas in square features is widely used, but a brief explanation is made here for clarity. Since a memory bit must be electrically addressed in both row and column dimensions of a memory array, at least one conductive line is required in each row and column of the array in order to uniquely address each bit or "cell". A conductive line along either a row or a column of the array may serve all bits located in the row or column. Thus, an array of N by M bits will require at least N by M conductive lines to electrically address all bits in the array. A bit can be thought of as occupying the area at the intersection of a row and a column. The minimum size of the intersection, in both row and column directions, is a conductive line width plus the width of the space between conductive lines. If both the conductive line width and space are each considered to be a "feature" in size, then the minimum area of a bit is two features by two features, or four square features in area (i.e. 2F×2F=4F²).

As technology is improved, the feature size is reduced, and so is the bit size, but the minimum bit is still said to be four square features in area. Most DRAM arrays manufactured to date have an ideal bit area of eight square features, and the size can be reduced to four square features in future products. In practice, various process tolerances generally prevent the ideal four or eight square feature size from being fully realized.

Many structures for DRAM cells have been proposed in order to reduce the array area below eight square features per bit. It is generally expected that some of the structures will be used in future DRAM products to achieve an array area of about four square features per memory bit. Therefore, a similar bit density will be needed to keep the precharge circuit cost competitive.

SUMMARY OF THE INVENTION

An object of the present invention is to provide a structure which will allow the array area of a DRAM with precharge circuits to be as low as four square features per memory bit.

2

In order to achieve the above object according to the present invention, a trench sidewall precharge transistor and sidewall precharge word line are integrated in a compact structure with a chosen DRAM cell structure. The trench and precharge circuits also serve as a physical and electrical separation between adjacent cells on opposite sides of the trench. As a result, a common isolation structure can be eliminated, and no added array area is required for precharge circuits.

An exemplary DRAM cell structure, and a very similar variation, are chosen to illustrate the present invention. The structures are only exemplary, and different cell structures can be chosen for integration with the invention if desired. Thus the invention is independent of the particular cell structures chosen herein for the purpose of illustration.

The reduced bit area provided by the present invention also reduces the associated bit line length by essentially 50% relative to a planar configuration disclosed in U.S. Pat. No. 5,414,656 previously referenced. The shortened bit line has substantially lower capacitance per bit, which synergistically enhances the low charge consumption DRAM technique taught in U.S. Pat. No. 5,414,656, and makes the technique even more attractive for low power and battery driven applications. The combination of very high density and very low power is highly desirable in DRAM products.

REFERENCE NUMERALS IN THE DRAWINGS

10 Semiconductor substrate material of a first conductivity type.
101 Semiconductor substrate material of a second conductivity type.
110 Doped well in substrate 101.
11 Bit line diffusion and junction.
12 One device cell transistor channel region.
13 Trench in semiconductor substrate.
14 DRAM cell access word line.
15 Planar FET gate dielectric.
16 Cap insulator on an access word line.
17 Sidewall insulator on access word line.
18 Storage node diffusion and junction.
19 Contact stud.
20 Trench sidewall gate dielectric.
21 Trench sidewall precharge word line.
22 Diffusion region and junction.
23 Trench fill material of doped oxide.
24 Trench fill dielectric.

25 Insulator.
31 Silicon oxide.
32 Silicon nitride.
41 Photo resist.
42 Poly crystalline silicon layer.
43 Photo resist.
44 Poly crystalline silicon layer.
45 Silicon nitride.
46 Photo resist plug.
47 Silicon oxide.
48 Photo resist.

DETAILED DESCRIPTION OF THE PREFERRED EMBODIMENTS

Figure 1A:
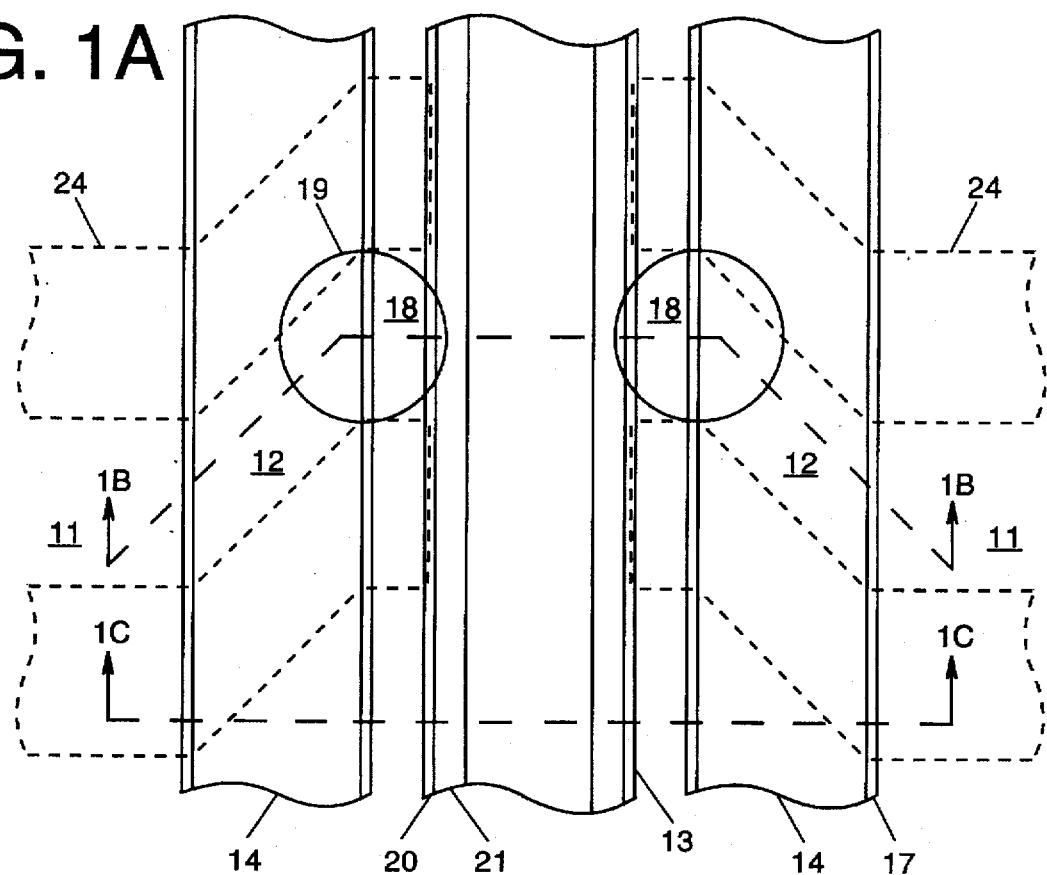
FIG. 1A is a top view of the first embodiment.

FIG. 1A is an illustrative top view of a first embodiment of the present invention. The first embodiment has fewer self aligning structural features than the second embodiment to be discussed later. As a result, the first embodiment is limited to a minimum size of about five square features, one square feature larger than the second embodiment minimum size of four square features. The reason for the difference in size will become apparent later.

Returning to FIG. 1A, a portion of a memory array representing two one device cells of a chosen cell structure, and their corresponding precharge circuits, is illustrated. Some partial structure of adjacent bits is also shown to make the repetitive array structure discernible. For simplicity, only those elements of the chosen cell structure necessary to illustrate the present invention are shown.

Figure 1B:
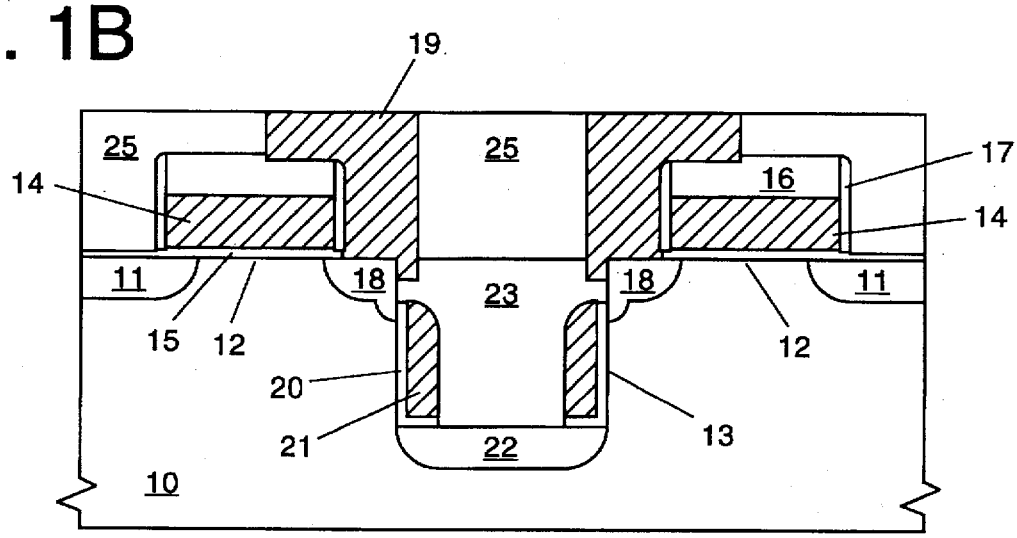
FIG. 1B is a sectional view of the first embodiment.

FIG. 1B is a schematic cross section of FIG. 1A as indicated, and shows vertical structural features in a common simplified fashion. Cross section 1B begins on the left in a bit line diffusion region 11 formed in a semiconductor substrate 10. It next cuts a one device cell planar access transistor channel region 12, a trench 13, another one device cell channel 12, and ends on the right in a second bit line diffusion 11. Diffusion 11 and substrate 10 are of opposite conductivity types. Conventional conductive poly silicon (i.e. poly crystalline silicon) word lines 14 gate access transistor channel regions 12 thru gate dielectric 15. Caping dielectric 16 and sidewall spacer dielectric 17 insulate the access word lines. A conventional conductive bit line is not shown for simplicity, but is commonly understood to run orthogonal to word lines 14, and contact bit line diffusions 11 near the end arrows of cross section 1B.

In FIG. 1A the dashed line features represent isolation regions 24 between diffusions and transistor channels of adjacent cells. Conventional dielectric or poly silicon filled trench isolation can be used for 24.

FIGS. 1A and 1B assume a well known stacked storage capacitor structure above word lines 14 is used for the memory storage capacitors. For simplicity, these capacitors are also not shown. As is conventional, they would contact the storage node diffusions 18 via poly silicon contact studs 19.

On the walls of trench 13 is a gate dielectric 20, and integral poly silicon gates and precharge word lines 21, which constitute the precharge circuits for the DRAM cells in FIG. 1A. Precharge word lines 21 are essentially parallel to access word lines 14. A diffusion 22 in the bottom of trench 13 provides a conductive line to supply a precharge voltage to the precharge circuits on both sides of the trench. Diffusions 11, 18, and 22 are of opposite conductivity type to substrate 10, and therefore form PN junctions in the substrate. Integral poly silicon gates and precharge word lines 21 gate precharge transistor channel regions extending between diffusion junctions adjacent to the trench walls.

Figure 5A:
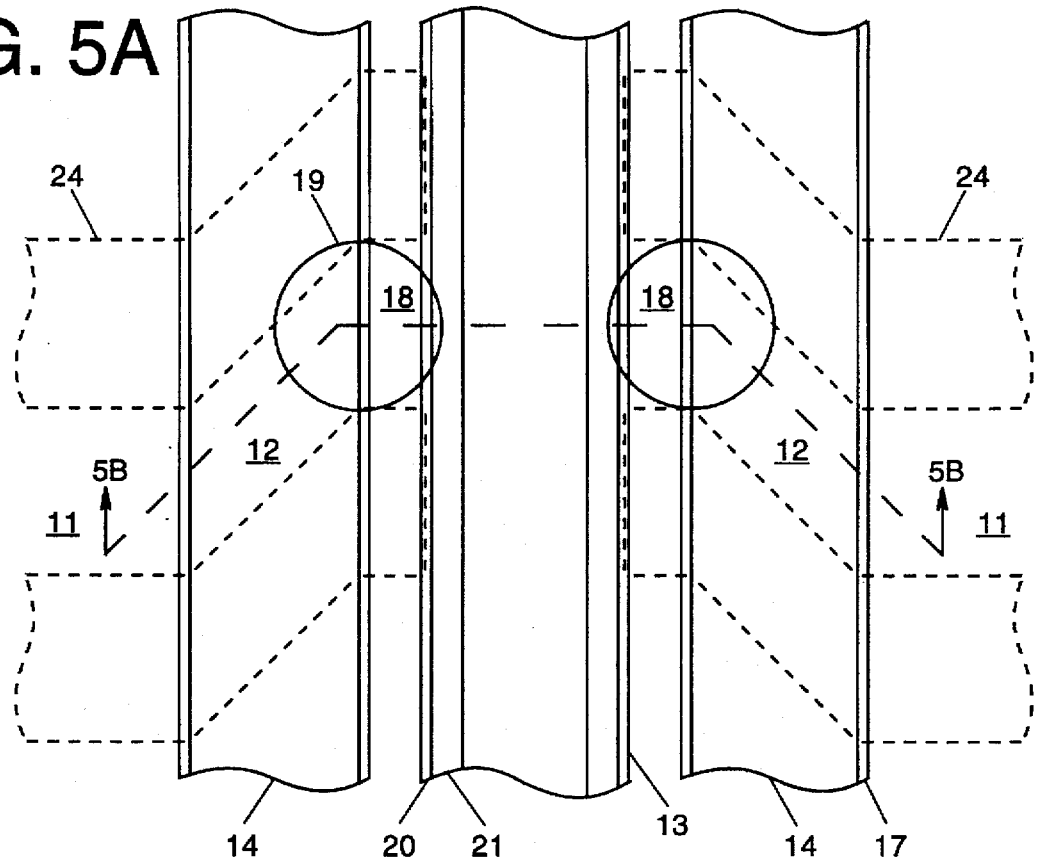
FIG. 5A is a top view of the first embodiment using a variation of the DRAM cell.
Figure 5B:
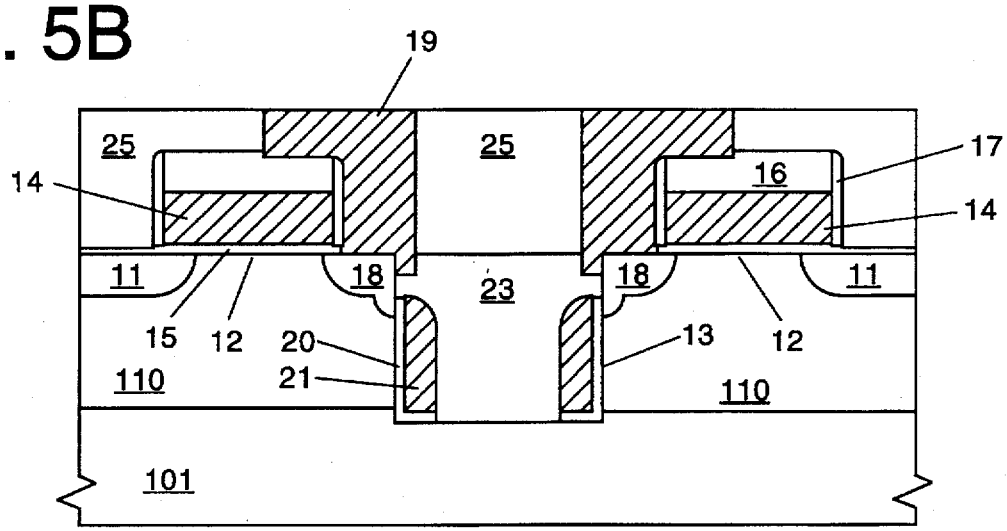
FIG. 5B is a sectional view of FIG. 5A.

A common alternative memory cell structure which is very similar to FIGS. 1 is shown in FIGS. 5A and 5B. DRAM cells are formed in a doped well 110 which is of opposite conductivity type to substrate 101. Other reference numerals in FIGS. 5 identify the same elements and have the same meaning as in FIGS. 1. Doped well 110 in FIGS. 5 is of the same conductivity type as substrate 10 in FIGS. 1. Substrate 101 in FIGS. 5 is of the same conductivity type as diffusion 22 in FIGS. 1. In the present invention, substrate 101 is functionally analogous to diffusion 22, because an applied substrate bias provides a precharge voltage source for the precharge circuits. In FIGS. 5, a trench bottom diffusion having the same conductivity type as substrate 101 can be used to improve conductivity of the precharge current path in the substrate, but is not essential, and is not shown. The present invention is illustrated in both FIGS. 1 and FIGS. 5, and is independent of which configuration is utilized. Fabrication of the structures in FIGS. 1 and 5 is done in the same way, except for the use of different substrate conductivity types, and an ion implant step to form doped well 110 for FIGS. 5. Common details of fabrication are described later.

Returning to FIGS. 1, a dielectric material 23 fills trench 13 and insulates precharge word lines 21 and diffused line 22. Conductive poly silicon elements 14, 19, and 21 are hatched to distinguish them, and are often of the same conductivity type as diffusions 11, 18, and 22, although either 14 or 21 may be of opposite conductivity type. A thick insulating layer 25 surrounds studs 19 and word lines 14.

Note particularly, that the structure in trench 13 does more than provide the elements of the storage node precharge circuits. In normal operation of the precharge circuits, one of the sidewall precharge word lines 21 is always biased to the off condition. As a result, the structure in trench 13 also provides an electrical isolation between cells on opposite sides of the trench. That is, no current can flow directly form one cell to the other across the trench. As a result, the trench both physically and electrically separates the cells on opposite sides of the trench. Thus a conventional isolation structure normally used between adjacent cells can be replaced by trench 13. Since trench 13 requires about the same physical space as a conventional isolation, the bit storage area is not increased by the presence of precharge circuits.

The center of trench 13 in FIGS. 1A and 1B marks the boundary between mirror image precharge circuits on either side of the trench. Similarly, the center of bit line diffusion 11 (For example, the 1B arrow.) marks the boundary between mirror image DRAM cells on either side of the bit line diffusion.

In FIG. 1A the horizontal distance between the center of bit line diffusion 11 and the center of trench 13 is the "width" of the array area for one storage bit, including both a cell and a corresponding precharge circuit. This width consists of one half feature for one half of diffusion 11, plus one feature for the width of word line 14, plus approximately one feature for the distance from the side of 14 to the center of trench 13, a total of about two and one half features for the bit width.

The "height" of the array area for one memory bit consists of one feature for diffusion 11 plus one feature for isolation 24, for a total height of two features. The height may also be thought of as one feature for the bit line conductor (not shown) plus one feature for the space between bit lines (also not shown), resulting in the same total height of two features. Therefore, the total array area per bit for the DRAM cell and corresponding precharge circuit is approximately two and one half features width by two features height, or about five square features (i.e. $2.5F \times 2F = 5F^2$).

Figure 1C:
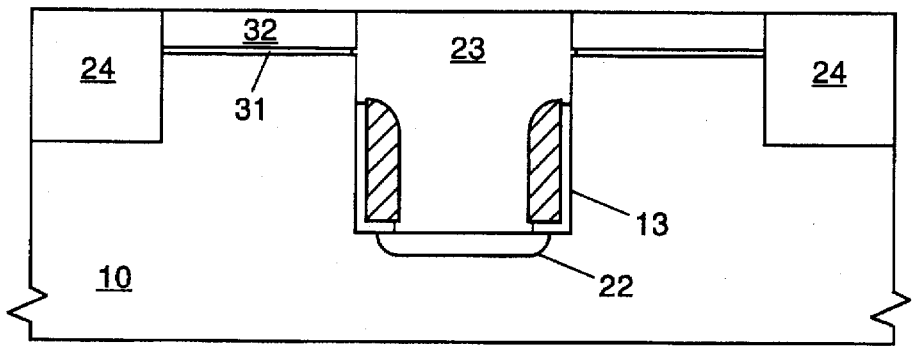
FIG. 1C is a sectional view of the first embodiment during fabrication.
Figure 2D:
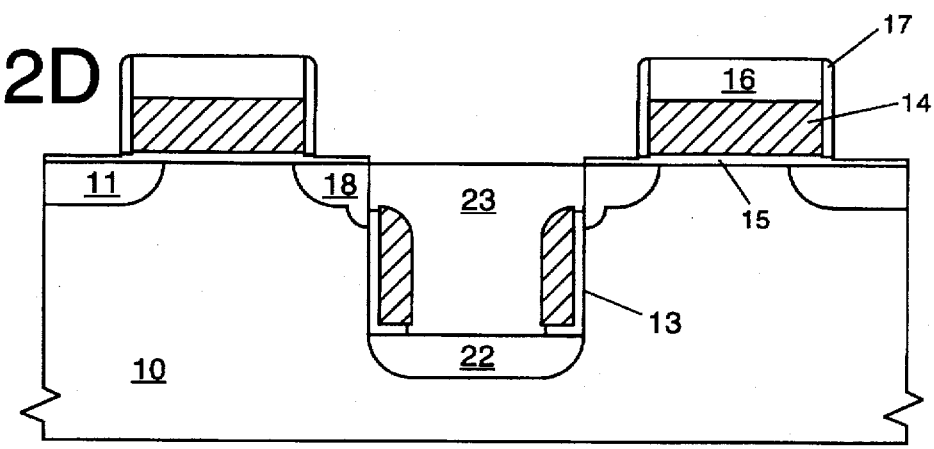
FIGS. 2A–2E are views of the FIG. 1B section during fabrication.
Figure 2E:
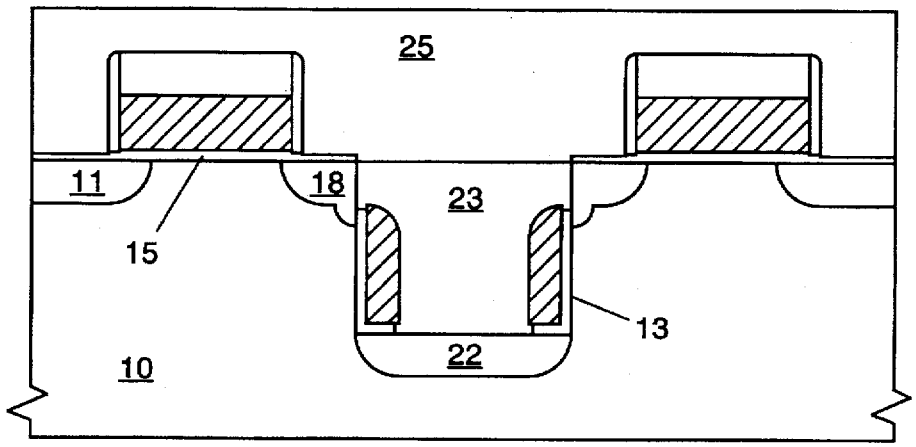
Figure 2A:
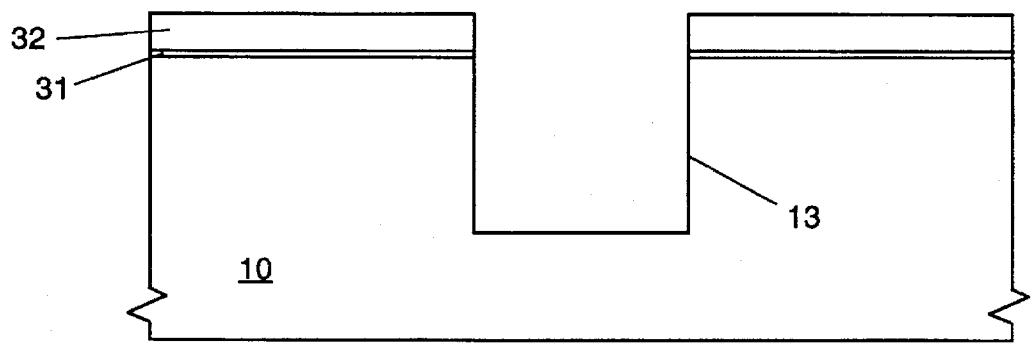
Figure 2B:
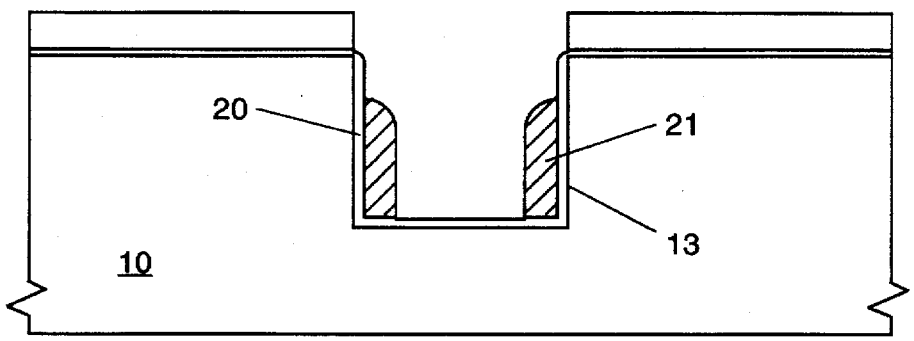
Figure 2C:
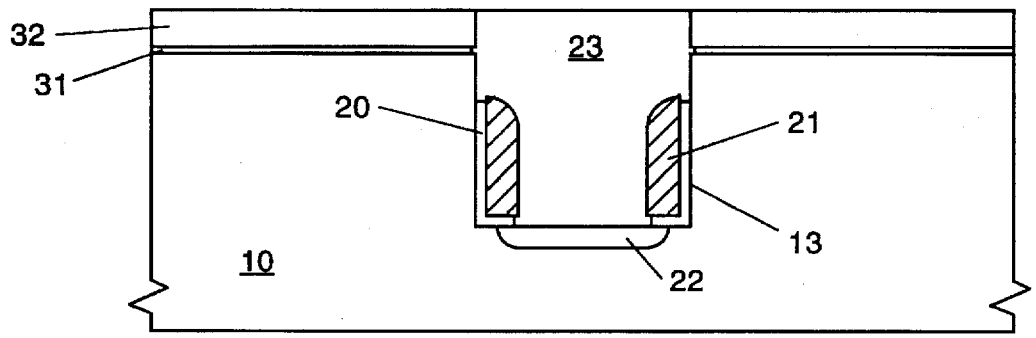

The structure of FIGS. 1 and FIGS. 5 can be fabricated by many conventional process sequences. The precise details are not essential to the present invention. An exemplary sequence follows below. Note FIGS. 2A thru 2E are sketches of the FIG. 1B cross section at various stages of the process sequence. FIG. 1C is a sketch of the 1C cross section at Step 7. As indicated earlier, FIGS. 5 require an ion implant step to form doped well 110; the implant is assumed to precede the following common process sequence.

Step 1: See FIG. 2A. Form silicon oxide layer 31 and silicon nitride layer 32 on single crystal silicon substrate wafer 10. Mask and etch trench 13 using well known reactive ion etch (RIE) methods.

Step 2: See FIG. 2B. Form gate dielectric 20 in trench 13 using known methods.

Step 3: Deposit a doped poly silicon layer and directionally etch using an appropriate known RIE method to form sidewall word lines 21.

Highly selective etching of silicon relative to both silicon dioxide and silicon nitride has been described by Nguyen et al. in "Substrate Trenching Mechanism during Plasma and Magnetically Enhanced Polysilicon Etching," J. Electrochem. Soc., Vol. 138, No. 4, April 1991, pp1112–1117, incorporated herein by reference.

Note that left and right sidewall word lines are joined at the trench ends immediately after etching, and can be separated from one another near the trench ends by a mask and etch. Separate contacts to the separated word lines can then be made as required. See disclosure by Kenney, "Self Aligned U-Groove Gates for Field Effect Transistors," IBM Technical Disclosure Bulletin, Vol. 22, No. 10, March 1980, pp4448–4449.

Step 4: See FIG. 2C. Ion implant to form diffusion 22, if it is used, in the trench bottom. Diffusion 22 can be separately contacted near the trench end where sidewall lines 21 are removed, via a deep contact hole to the trench bottom or a reach thru diffusion.

Step 5: Use buffered hydrofluoric acid (BHF) to remove the portion of oxide 20 not covered by lines 21.

Step 6: Deposit a doped oxide layer to fill trench 13, and chemical mechanical polish to planarize the oxide at the surface level of nitride layer 32 using a known method. Oxide 23 thereby fills trench 13. The dopant in the oxide should be of the same conductivity type as used for diffusions 11 and 18 in Step 9 below.

Filling and plararizing a trench with dielectric has been described by Davari et al. in "A New Planarization Technique, Using a Combination of RIE and Chemical Mechanical Polish (CMP)," International Electron Devices Meeting, December 1989, pp. 61–64, incorporated herein by reference.

Step 7: Form oxide filled trench isolation regions 24 using a known method such as that of Davari et al. referenced in Step 6 above. FIG. 1C illustrates cross section 1C of FIG. 1A at this stage of the process. A trench isolation process is also described by Fazen et al. in "A Highly Manufacturable Trench Isolation Process for Deep Submicron DRAMs," International Electron Devices Meeting, December 1993, pp57–60, incorporated herein by reference.

Step 8: See FIG. 2D. Remove nitride 32 and oxide 31. Use conventional planar fabrication methods to form conductive poly silicon word lines 14 and insulating layers 15, 16, and 17. The insulating layers 16 and 17 should consist, in whole or in part, of an insulating material that can be used as a mask for RIE etching of silicon dioxide later in the process. Silicon nitride is known to be a suitable material. Aluminum oxide has also been used.

Step 9: Ion implant doping and anneal at high temperature to produce diffusions 11 and 18. Note diffusion of doping from doped dielectric 23 will tend to produce the downward projection of diffusion 18 on the sidewall of trench 13. Diffusion 22 is deepened by the anneal.

Step 10: See FIG. 2E. Deposit an oxide dielectric layer and polish planarize it to form dielectric 25. The dielectric may be appropriately doped like oxide 23 if desired.

Step 11: See FIG. 1B. Mask and selectively etch contact holes thru dielectric 25 and oxide 15. Deposit doped poly silicon, and mechanically polish or RIE etch it down to the surface of dielectric 25 to form contact studs 19.

Any of several well known methods can be used to form DRAM bit line conductors connecting to diffusions 11, and stacked capacitor structures connecting to studs 19. Exemplary methods and structures are described by Kimura et al. in "A Diagonal Active-Area Stacked Capacitor DRAM Cell with Storage Capacitor on Bit Line," IEEE Transactions on Electron Devices, Vol. 37, No. 3, March 1990, pp737–743, incorporated herein by reference.

Note the invention is not limited to stacked capacitor structures. For example, a capacitor in which an appropriately repositioned stud 19 connects diffusion 18 to a poly silicon storage node inside a trench located in a portion of isolation region 24 could also be used. U.S. Pat. No. 4,801,988, "Semiconductor Trench Capacitor Cell with Merged Isolation and Node Trench Construction," issued to Kenney, Jan. 31, 1989, illustrates a suitable trench capacitor structure.

Second Embodiment

Figure 3A:
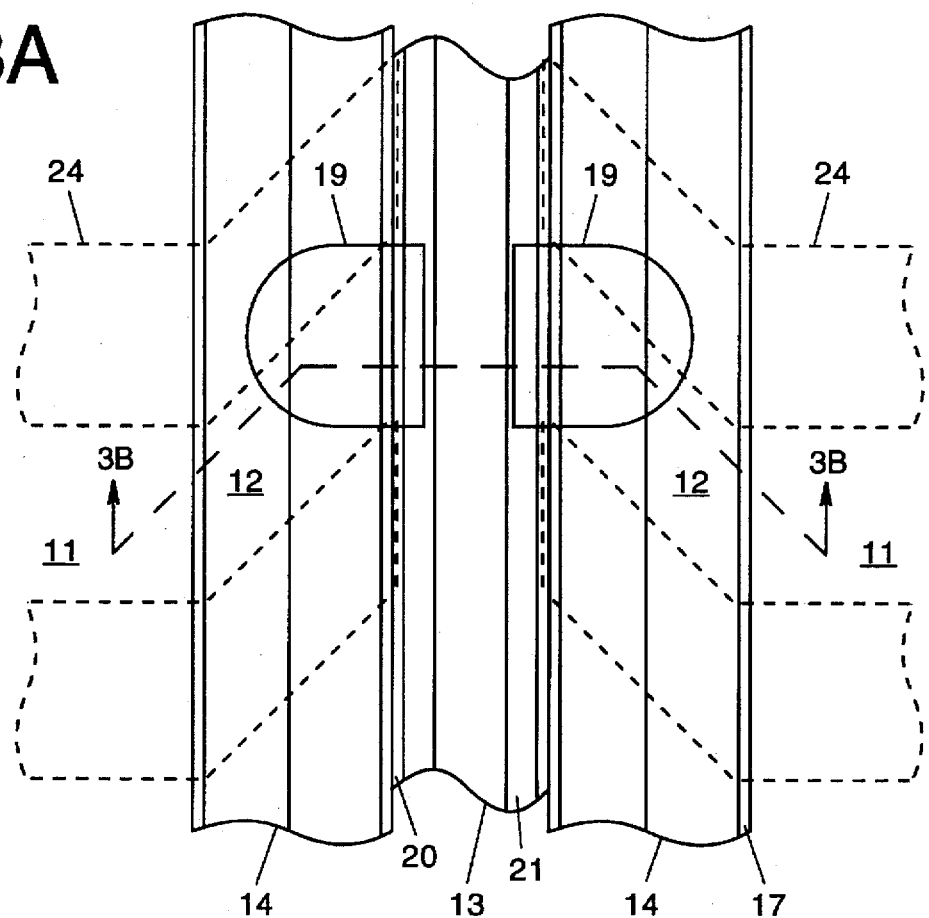
FIG. 3A is a top view of the second embodiment.
Figure 3B:
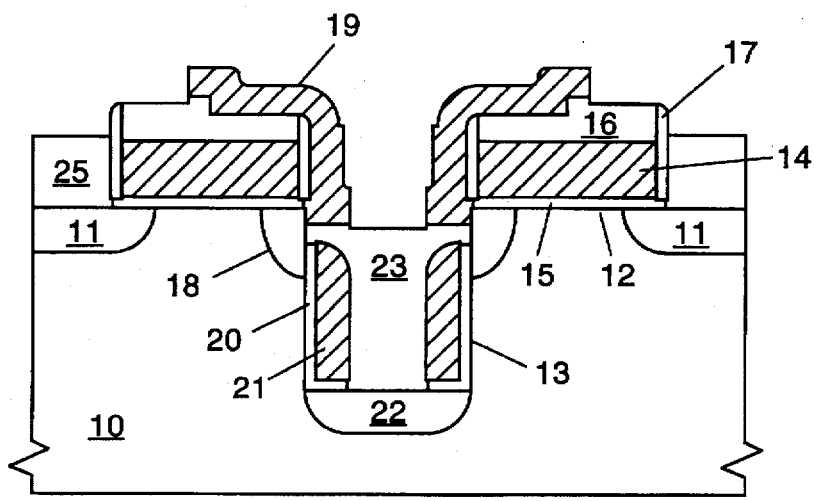
FIG. 3B is a sectional view of the second embodiment.
Figure 4A:
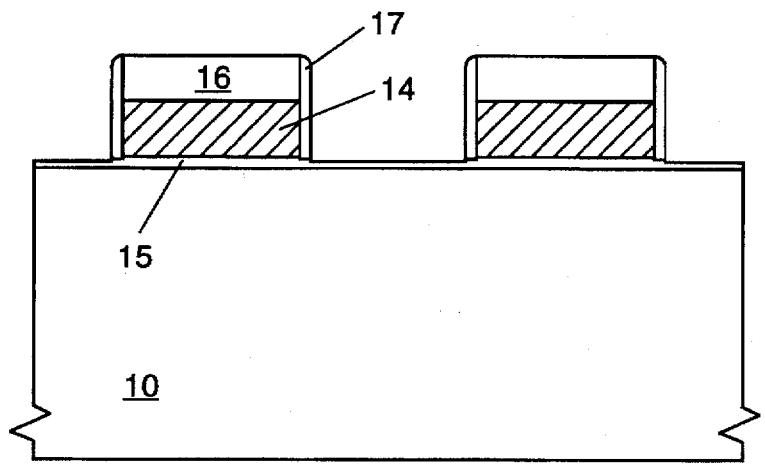
FIGS. 4A–4L are views of the FIG. 3B section during fabrication.
Figure 4B:
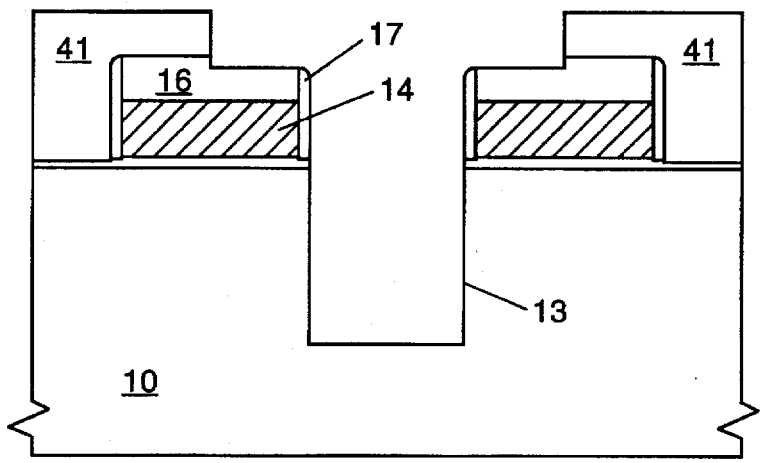
Figure 4C:
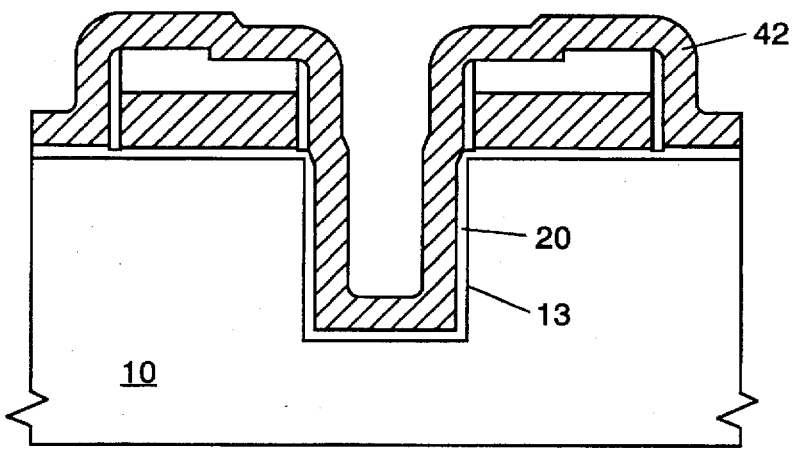
Figure 4D:
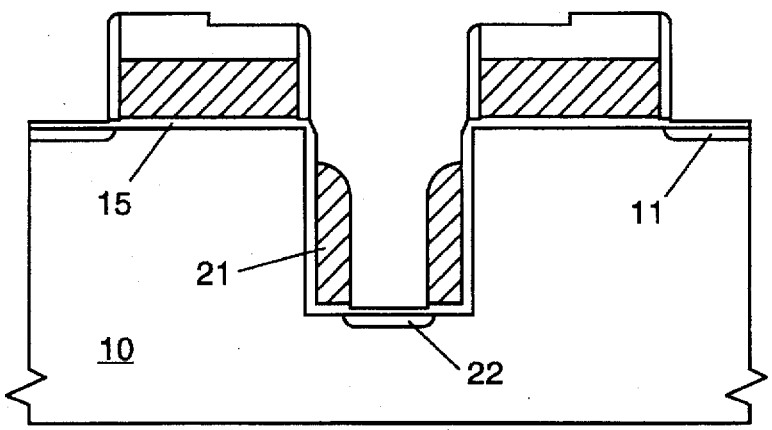
Figure 4E:
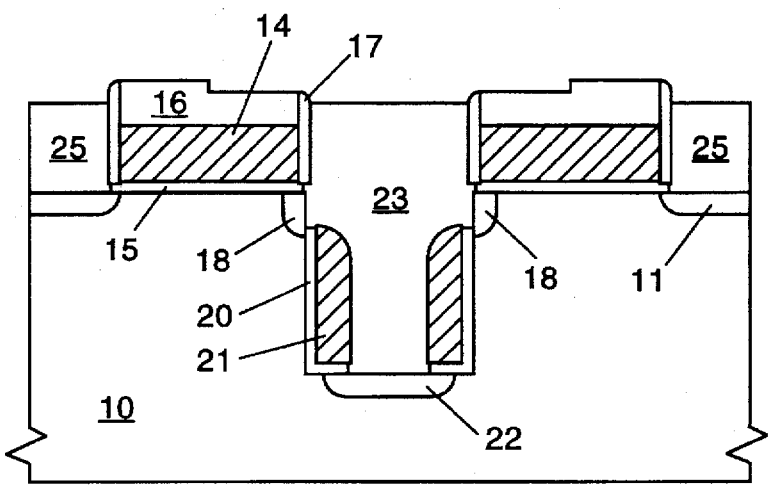
Figure 4F:
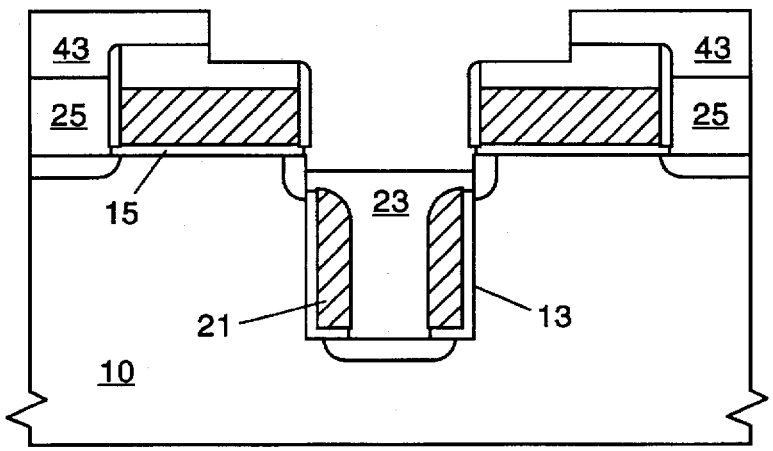
Figure 4G:
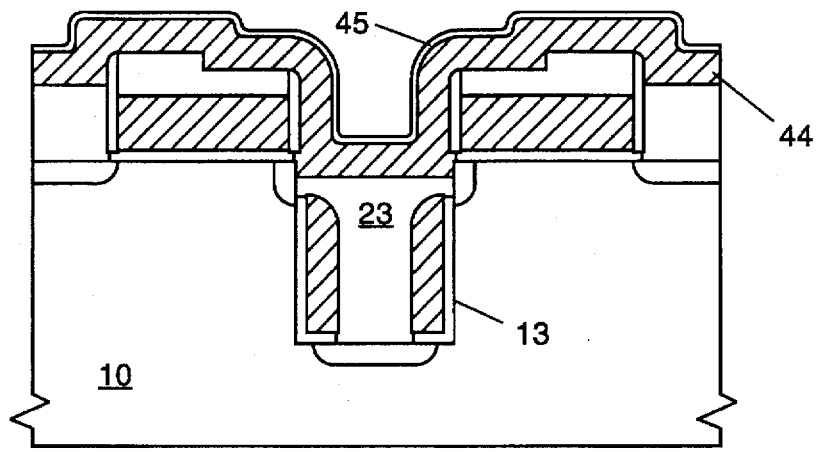
Figure 4H:
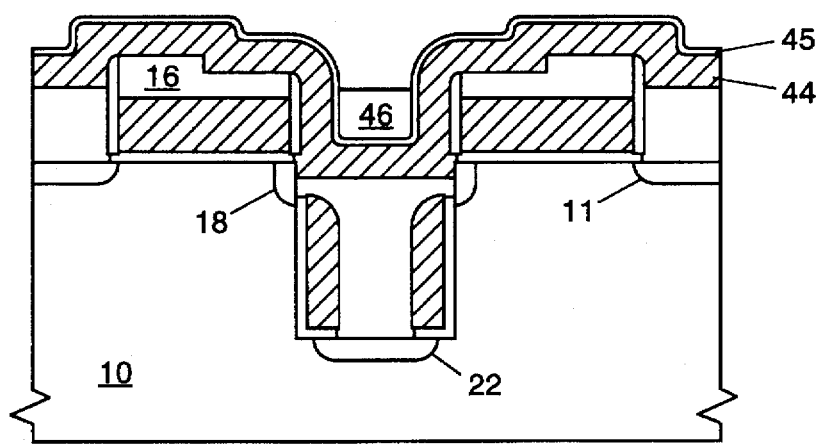
Figure 4I:
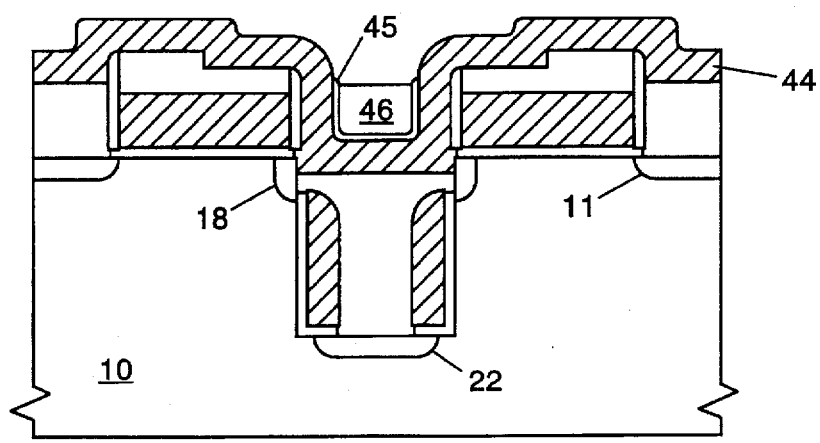
Figure 4J:
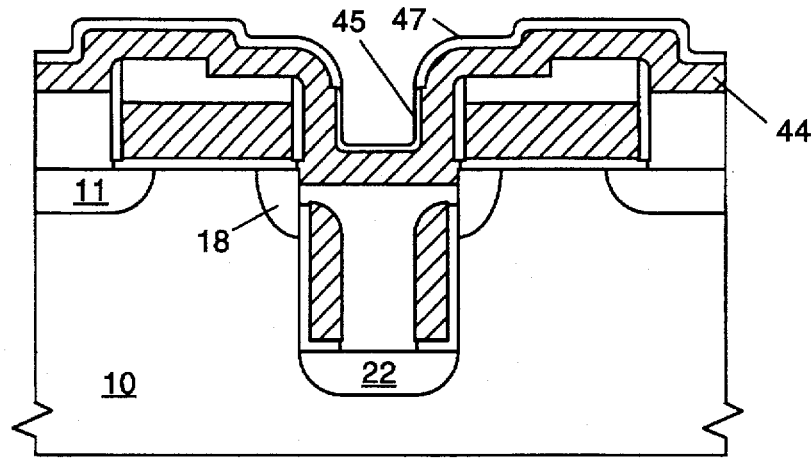
Figure 4K:
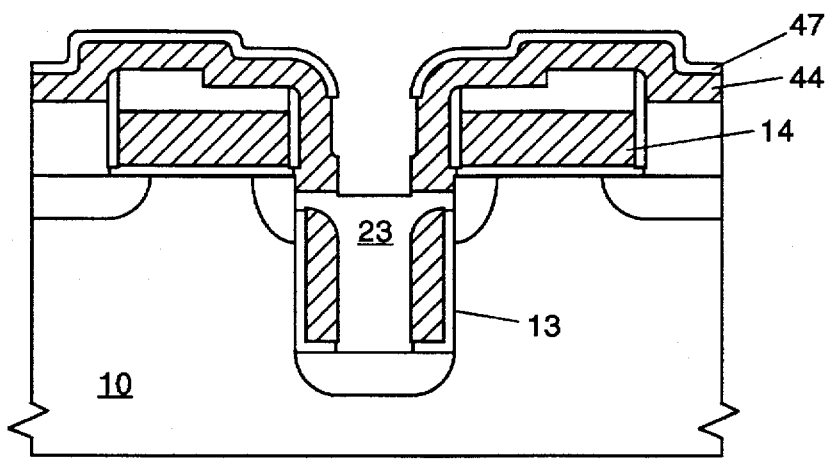
Figure 4L:
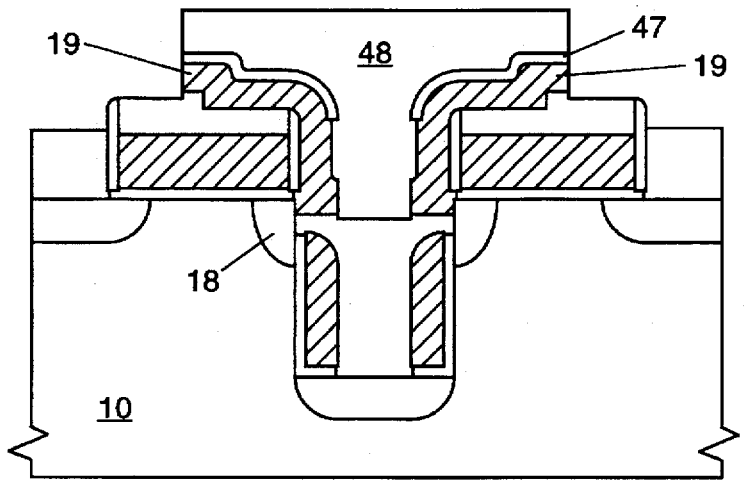

A second embodiment of the present invention is shown in FIGS. 3A and 3B, which are analogous to FIGS. 1A and 1B. The second embodiment utilizes self aligning effects to make a four square feature bit area possible. Reference numerals in FIGS. 3 identify the same elements and have the same meaning as in FIGS. 1.

Figure 6A:
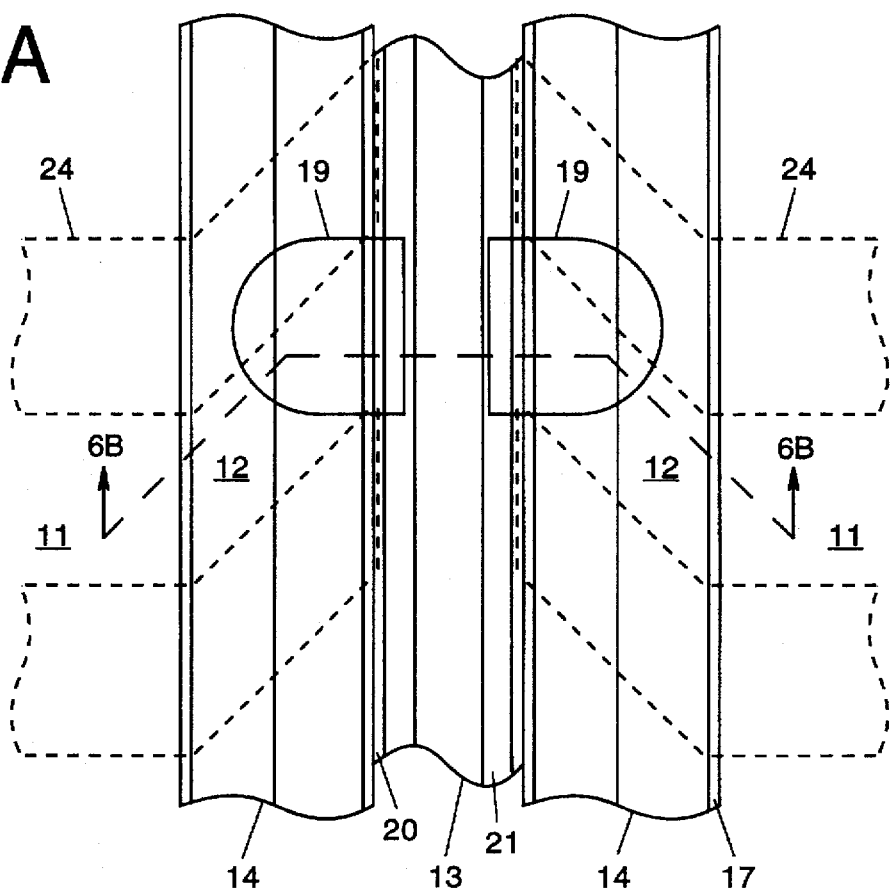
FIG. 6A is a top view of the second embodiment using a variation of the DRAM cell.
Figure 6B:
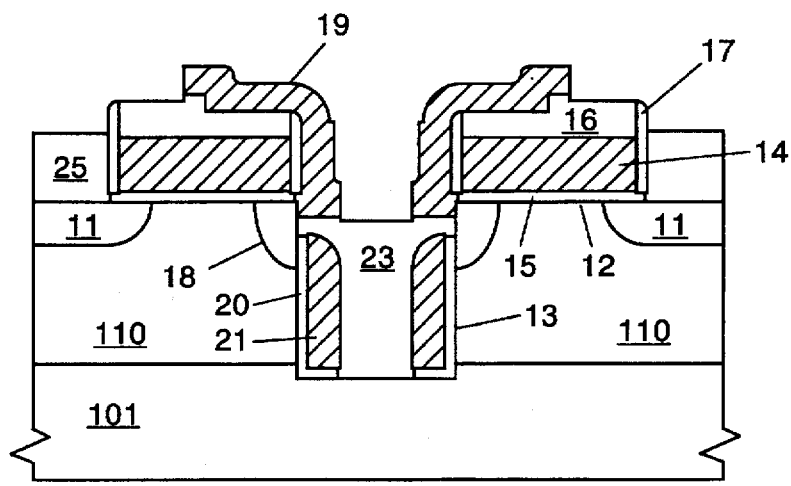
FIG. 6B is a sectional view of FIG. 6A.

FIGS. 6A and 6B show a common alternative memory cell structure for the second embodiment, analogous to the FIGS. 5 alternative for the first embodiment. As in FIGS. 5, the DRAM cells are formed in a doped well 110 of opposite conductivity type to substrate 101, and an applied substrate bias provides a precharge voltage source for the precharge circuits. Reference numerals in FIGS. 6 identify the same elements and have the same meaning as in FIGS. 5. The present invention is illustrated in both FIGS. 3 and FIGS. 6, and is independent of which configuration is utilized.

Returning to FIGS. 3, trench 13 is made self aligned and nearly adjacent to word line 14 by using 14 as part of the mask for etching 13. Contact stud 19 is also defined in a self aligned fashion on one side of word line 14. These two self aligned features permit the width of the bit structure, including precharge circuits, to consist of approximately one half feature for one half of bit line diffusion 11, plus one feature for word line 14, plus one half feature for one half of trench 13, for a total of two features width.

The height of the FIG. 3A bit structure is the same as the FIG. 1A bit structure height. Therefore, the FIG. 3A bit structure area is about two features by two features for a total of four square features (i.e. $2F \times 2F = 4F^2$).

The structures of FIGS. 3 and 6 can be fabricated by many process sequences. The precise details are not essential to the present invention. An exemplary sequence follows. Note FIGS. 4A thru 4L are sketches of the FIG. 3B cross section at various stages of the process sequence. FIGS. 6 require an ion implant step to form doped well 110; the implant is assumed to precede the following common process sequence.

Step 1: Form oxide filled trench isolation patterns 24 using well known methods.

Step 2: See FIG. 4A. Use conventional planar fabrication methods to form conductive poly silicon word lines 14 and insulating layers 15, 16, and 17. The insulating layers 16 and 17 should consist, in whole or in part, of an insulating material that can be used as a mask for RIE etching of silicon and silicon dioxide when trench 13 is etched. Silicon nitride is known to be a suitable material.

Step 3: See FIG. 4B. Mask diffusion regions 11 and adjacent portions of isolation 24 with a photo resist masking layer 41 having terminating edges on top of word line insulating layer 16. Etch trench 13 selectively, using the word line insulating layers to define the trench edges along the length of sidewall insulator 17. Trench 13 is thus self aligned to the edge of 17, and consequently, also to 14.

Highly selective etching of silicon relative to both silicon dioxide and silicon nitride has been described by Nguyen et al. in "Substrate Trenching Mechanism during Plasma and Magnetically Enhanced Polysilicon Etching," J. Electrochem. Soc., Vol. 138, No. 4, April 1991, pp1112–1117, incorporated herein by reference.

The etching of silicon trench 13 will also generally require selective etching of silicon dioxide to form the trench thru portions of isolation regions 24 that protrude into the area of trench 13 because of normal misalignment between mask layers. In fact, it may be preferable for regions 24 to initially extend completely across the area of trench 13 in order to minimize sensitivity of the integrated structure to mask alignment tolerances. Selective etching of silicon oxide relative to silicon nitride has been described by Armacost et al. in "Selective Oxide:Nitride Dry Etching in a High Density Plasma Reactor," Electrochemical Society Meeting, May 1992, incorporated herein by reference. Other selective etchants for silicon dioxide relative to silicon nitride have been described in U.S. Pat. No. 4,966,870 issued to Barber et al., Oct. 30, 1990.

Step 4: See FIG. 4C. Form gate dielectric 20 in trench 13 using known methods, and deposit a conformal poly silicon layer 42.

Step 5: See FIG. 4D. RIE layer 42 to form sidewall word lines 21. Note layer 42 should be etched sufficiently that the top edges of word lines 21 are positioned below the level of planar gate dielectric 15.

Step 6: Ion implant doping to form diffusion 11, and diffusion 22 if used.

Step 7: See FIG. 4E. Use BHF to remove the residual portions of oxides 20 and 15 not covered by layers 14, 17, and 21.

Step 8: Deposit a thick doped oxide, polish to planarize, and RIE etch to a level below the top of insulator 16, thus forming residual insulator 23 filling trench 13, and insulator 25 covering diffusions 11. Anneal at high temperature to form diffusions 18 and to extend diffusions 11 and 22. The dopant in the oxide should be of the same conductivity type as that used for diffusion 11 in Step 6 above.

Step 9: See FIG. 4F. Print photo resist mask 43 similar to the previous mask 41.

Step 10: Selectively RIE etch oxide 23 in trench 13 to position the oxide 23 top level below insulator 15 and above precharge word lines 21.

Step 11: See FIG. 4G. Strip mask 43. Deposit doped poly silicon layer 44 and silicon nitride layer 45.

Step 12: See FIG. 4H. Coat wafer with photo resist and etch the resist selectively to position the top resist level below the top of insulator 16, forming residual resist plug 46.

U.S. Pat. No. 4,295,924 issued to Garnache et al. Oct. 20, 1981 presents this technique for forming a self aligned resist in a recessed structure using a wet resist etchant. Today, any directional dry resist etch commonly used for photo resist removal is probably preferred.

Step 13: See FIG. 4I. Selectively etch away exposed nitride 45 using resist plug 46 as a mask.

Step 14: See FIG. 4J. Remove resist plug 46 and thermally oxidize poly silicon layer 44 to form oxide 47. The thermal oxidation deepens diffusions 11, 18, and 22.

Step 15: See FIG. 4K. Remove remaining silicon nitride 45 and RIE poly silicon layer 44 to expose oxide 23 in trench 13. Note the edge etched on layer 44 is displaced from, but self aligned to, the edge of word line 14, thus eliminating normal mask alignment tolerance between the edge positions.

Step 16: See FIGS. 4L and 3A. Print photo resist mask 48 and RIE to remove unmasked portions of oxide 47 and poly silicon 44, leaving poly silicon contact studs 19 connected to diffusions 18.

Step 17: See FIG. 3B. Remove mask 48 and remaining portions of oxide 47.

Any of several well known methods can be used to form DRAM bit line conductors connecting to diffusions 11, and stacked capacitor structures connecting to studs 19. Note the second embodiment also is not limited to stacked capacitor structures. For example, a capacitor in which an appropriately repositioned stud 19 connects diffusion 18 to a poly silicon storage node inside a trench located in a portion of isolation region 24 could also be used.

All of the word line, diffusion, and contact stud structures utilized in the forgoing description are subject to resistive limitations, and can be enhanced in conductivity by use of silicides and conductive straps as is often done. Those skilled in the art will recognize how to add conventional conductivity enhancements that may be desired.

What is claimed is:

1. An array of dynamic random access memory cells of a chosen cell structure formed on a semiconductor substrate, said cells arranged in rows and columns, each said cell including a first PN junction utilized as a storage node junction, a second PN junction utilized as a bit line junction, and a first transistor channel region located between said first PN junction and said second PN junction, and, a first word line in each said column disposed so as to gate said first transistor channel regions, the improvement comprising:

a. trenches in said semiconductor substrate disposed adjacent the first PN junctions, and b. a third PN junction disposed adjacent each said trench and physically separated from the first and second PN junctions, and c. a second word line along each column disposed substantially parallel to said first word line and having no contact to the first PN junctions, said second word lines further disposed in said trenches so as to gate second transistor channel regions extending from the first PN junctions to said third PN junction, the second word lines extending at least from the first PN junctions to the third PN junction.

2. An array according to claim 1 in which the trench separates said cells and said second transistor channel regions disposed adjacent a first trench sidewall from the cells and second transistor channel regions disposed adjacent a second trench sidewall.

3. A memory array according to claim 2 in which a second word line disposed adjacent said first trench sidewall isolates the cells disposed adjacent the first trench sidewall from the cells and second transistor channel regions disposed adjacent said second trench sidewall.

4. An array of dynamic random access memory cells of a chosen cell structure formed on a semiconductor substrate, said cells arranged in rows and columns, each said cell including a first PN junction utilized as a storage node junction, a second PN junction utilized as a bit line junction, and a first transistor channel region located between said first PN junction and said second PN junction, and, a first word line in each said column disposed so as to gate said first transistor channel regions, the improvement comprising:

a. trenches in said semiconductor substrate disposed adjacent the first PN junctions, and
   b. a third PN junction disposed adjacent each said trench and physically separated from the first and second PN junctions, and
   c. second transistor channel regions disposed on sidewalls of said trenches, said second transistor channel regions having a length dimension extending along a trench sidewall from a first PN junction to said third PN junction, a second word line along each column disposed substantially parallel to said first word lines and having no contact to the first PN junctions, said second word lines further disposed in said trenches so as to gate along the entire said length dimension of the second transistor channel regions.

5. An array according to claim 4 in which the trench separates said cells and said second transistor channel regions disposed adjacent a first trench sidewall from the cells and second transistor channel regions disposed adjacent a second trench sidewall.

6. A memory array according to claim 5 in which a second word line disposed adjacent said first trench sidewall isolates the cells disposed adjacent the first trench sidewall from the cells and second transistor channel regions disposed adjacent said second trench sidewall.

* * * * *